United States Patent [19]
Ohno

[11] Patent Number: 6,051,462
[45] Date of Patent: Apr. 18, 2000

[54] PROCESS FOR PRODUCING SEMICONDUCTOR DEVICE COMPRISING A MEMORY ELEMENT AND A LOGIC ELEMENT

[75] Inventor: Keiichi Ohno, Kanagawa, Japan

[73] Assignee: Sony Corporation, Tokyo, Japan

[21] Appl. No.: 09/129,086

[22] Filed: Aug. 5, 1998

[30] Foreign Application Priority Data

Aug. 6, 1997 [JP] Japan .................................. 9-211596

[51] Int. Cl.⁷ .............................................. H01L 21/8242
[52] U.S. Cl. .......................................... 438/241; 438/639
[58] Field of Search .................................. 438/240, 241, 438/253, 396, 637, 639

[56] References Cited

U.S. PATENT DOCUMENTS 5,288,655   2/1994   Higasitani et al. ...................... 438/241
5,700,706  12/1997   Juengling et al. ....................... 438/639
5,879,981   3/1999   Tanigawa .................................. 438/241

*Primary Examiner*—Chandra Chaudhari
*Attorney, Agent, or Firm*—Hill & Simpson

[57] ABSTRACT

The invention relates to a process for producing a semiconductor device comprising the following steps. A first insulating film and a second insulating film are formed along a shape of the gate electrode on the logic region of the semiconductor substrate. A contact hole is formed in the first and second insulating films in the cell region, and a side wall comprising a material preventing its own silicidation is formed on the inner wall thereof. A conductive material is embedded in the contact hole through a side wall to form a plug, and then the second insulating film is removed to expose the plug and the first insulating film. A spacer side wall is formed on the side wall of the gate electrode in the logic region, and the surface of the semiconductor substrate is exposed, followed by forming a silicide layer thereon. A first interlayer insulating film is formed on the semiconductor substrate, so as to flatten the surface and the upper surface of the plug is exposed.

6 Claims, 10 Drawing Sheets

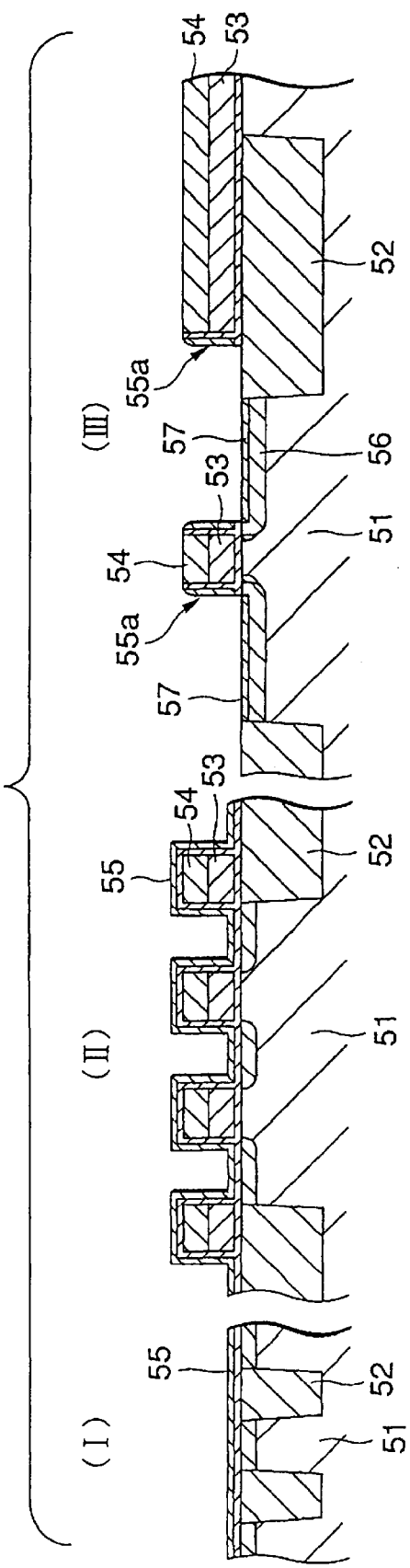

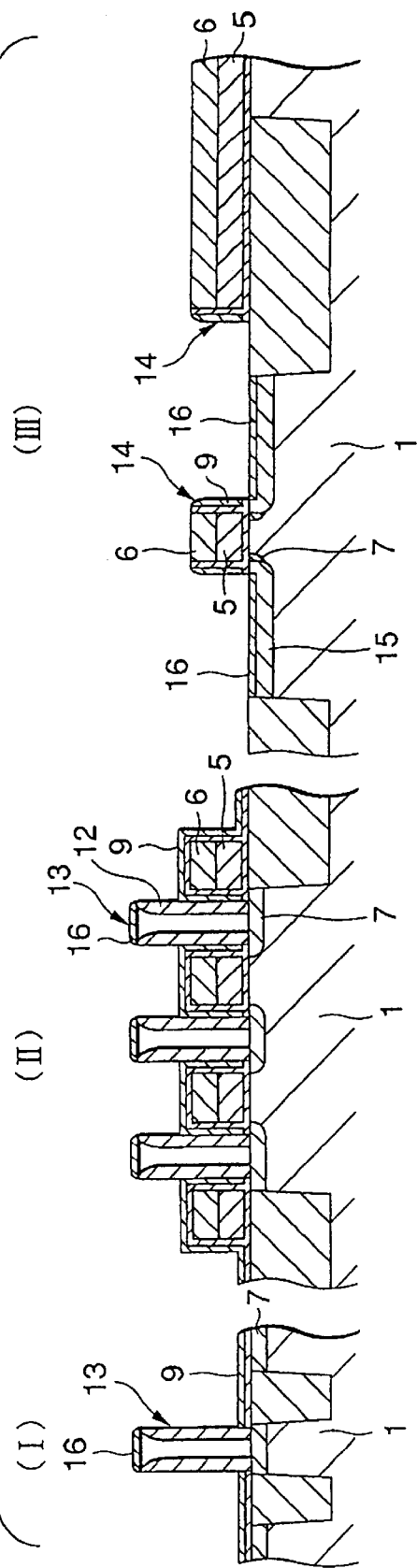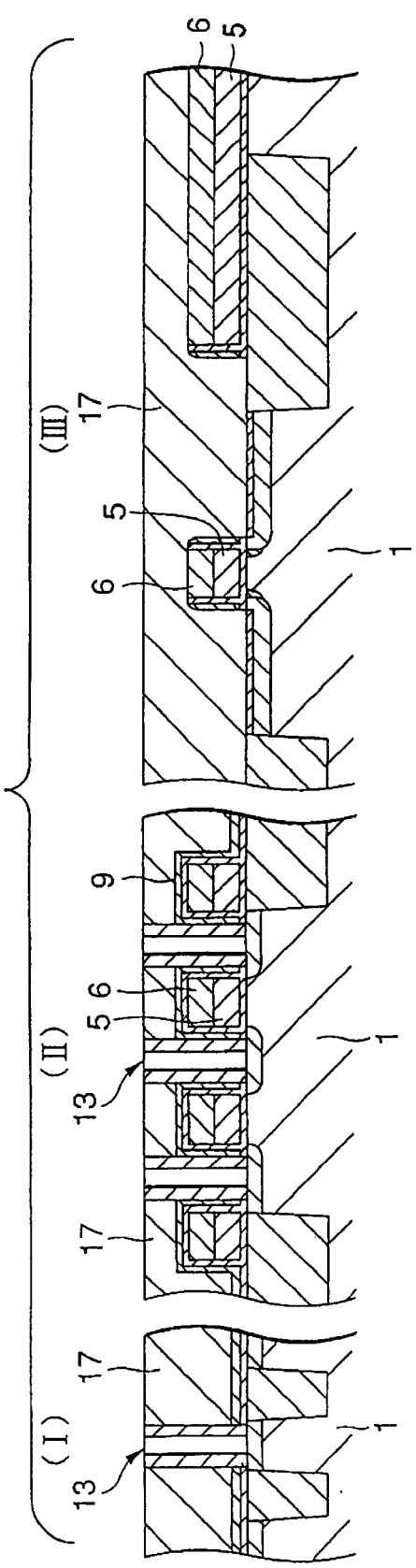

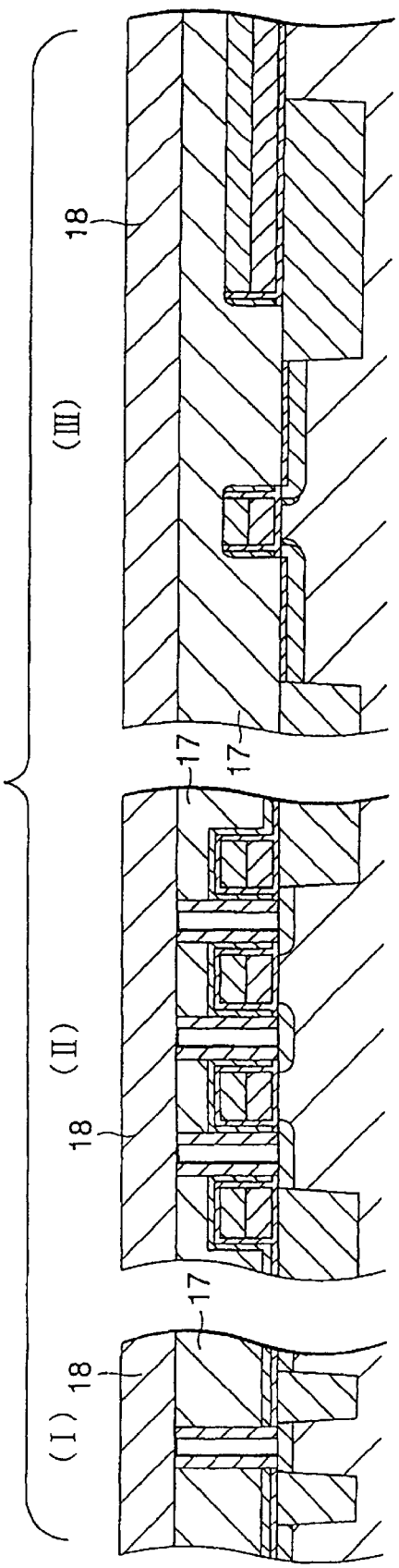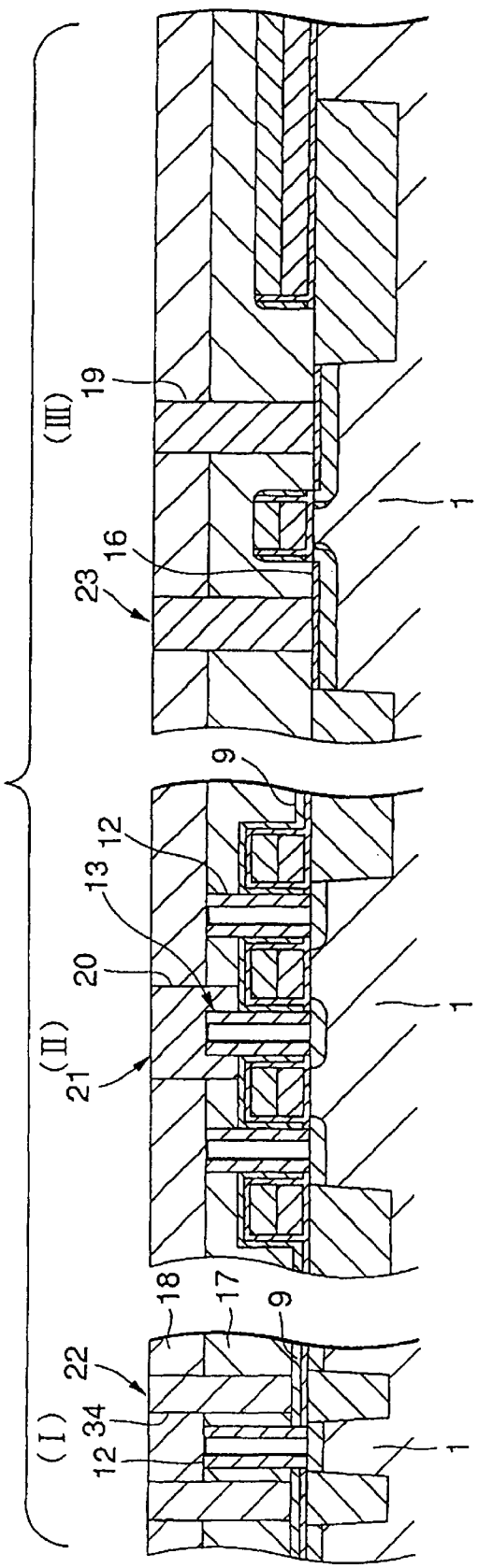

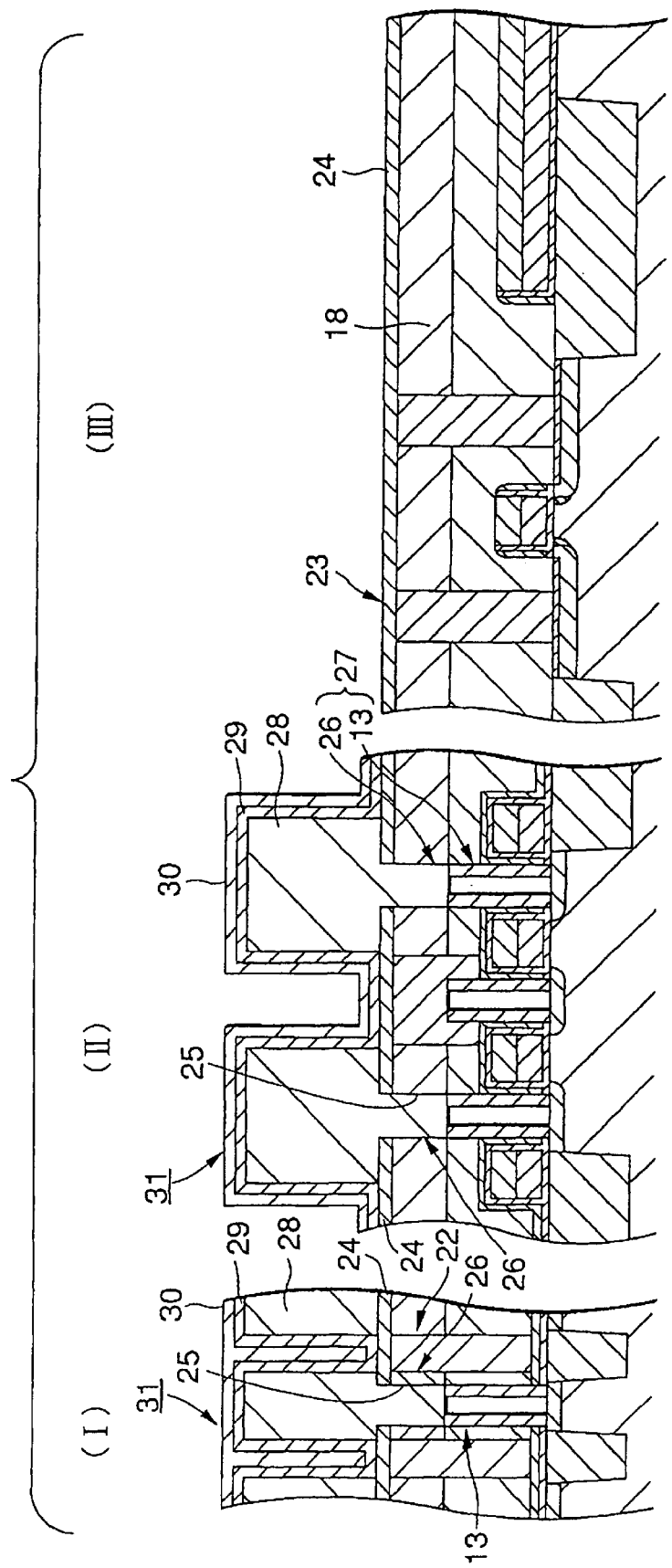

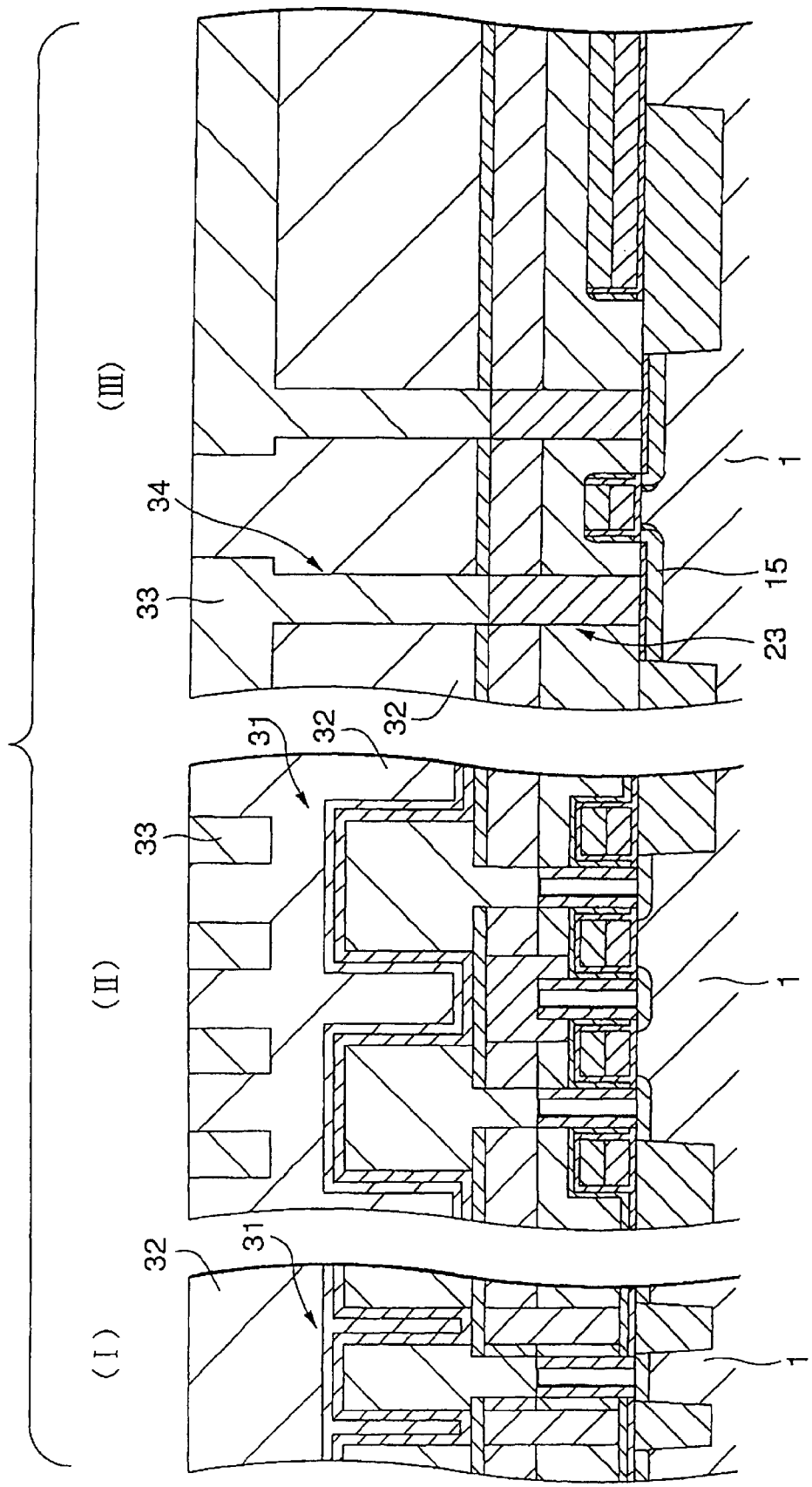

PROCESS FOR PRODUCING SEMICONDUCTOR DEVICE COMPRISING A MEMORY ELEMENT AND A LOGIC ELEMENT

FIELD OF THE INVENTION

The present invention relates to a process for producing a semiconductor device, and particularly relates to a process for producing a semiconductor device applied to an LSI comprising a memory element and a logic element consolidated therein.

BACKGROUND OF THE INVENTION

Recently, an LSI comprising a high capacity memory element and a high performance logic element consolidated on a semiconductor substrate is highly demanded. In order to realize a high capacity memory element, a DRAM cell that has high compatibility with a formation process of the logic element and has a small area per unit is demanded. Particularly, a memory cell having a COB (capacitor over bit line) structure is demanded, which is capable of reducing the cell area by forming a capacitor on a bit line (hereinafter referred to BL). In order to realize a high performance logic element, for example, it is necessary to form a metal alloy represented by a salicide (self-aligned silicide) or to reduce the resistance of a diffusion layer by a metallic backing represented by a BMD (buried metal on diffusion layer).

An example of conventional process where the COB structure is employed and the resistance of the diffusion layer is reduced is described by referring to FIG. 1. (I) is a cross sectional view of a region where a memory element is formed (hereinafter referred to "cell region") along the line perpendicular to the BL, (II) is a cross sectional view of the cell region along the line perpendicular to a word line (hereinafter referred to WL (word line)), and (III) is a cross sectional view of a region where a logic element is formed (hereinafter referred to "logic region"). In the conventional process shown in FIG. 1, a trench element separating region 52, a gate electrode 53 and an insulating film pattern 54 are formed on a semiconductor substrate 51, and then a silicon nitride ($Si_3N_4$) film 54 is formed on the whole surface of the semiconductor substrate 51. After the cell region is masked with a resist, a spacer side wall 55a composed of an $Si_3N_4$ film 55 is formed on the side wall of the gate electrode 53 and the insulating film pattern 54 in the logic region, and at the same time, the surface of the semiconductor substrate 51 located at a diffusion layer 56 is exposed. A silicide layer 57 is then formed on the exposed surface of the semiconductor substrate 51.

While not shown in FIG. 1, formation of a contact part, a BL, and a lower electrode, an insulating film and an upper electrode of a capacitor is formed in the cell region. For example, the contact part may comprise a poly-Si plug, and the BL may comprise a stacked body of a tungsten silicide ($WSi_2$) formed on a poly-Si layer. The lower and upper electrodes may comprise poly-Si, and the capacitor insulating film may comprise a silicon nitride ($Si_3N_4$) film and a silicon oxide ($SiO_2$) film.

In the process of forming the memory cell having the COB structure, a large step is formed between the cell region and the logic region due to the BL and the stacked capacitor. The margin in depth of focus (DOF) on lithography for forming an upper circuit over the cell region and the logic region is thus reduced, and processing of the circuit in the logic region becomes difficult. As a result, troubles such as etch residue on processing of the circuit arise to adversely affect the high integration of the logic element.

The formation of the poly-Si films for the BL and the lower and upper electrodes of the capacitor is generally conducted by a chemical vapor deposition (CVD) process. While the CVD process is generally conducted at about 600° C., a heat treatment is required after formation of the film for the activation of the impurities contained in the poly-Si film. In the formation of the capacitor insulating film composed of an $Si_3N_4$ film and an $SiO_2$ film, a heat treatment is required, for example, at from about 850 to 900° C. However, because the silicide layer formed in the logic region is low in heat resistance, it coagulates on the heat treatment to bring about deterioration in characteristics such as increase in resistance. Therefore, in the case where the silicide layer is formed to reduce the resistance of the diffusion layer, the heat treatment cannot be employed.

The formation process of the capacitor can be a low temperature process by employing an MIM (metal-insulator-metal) structure using a metal instead of the SIS (Si-insulator-Si) structure using the poly-Si. By substituting the conventional BL formed of a poly-Si film with a metal, it can be considered to conduct the BL formation process at a low temperature and to reduce the resistance of the BL.

However, it is unavoidable to use poly-Si for forming the contact part (particularly a memory node contact part connecting the lower electrode of the capacitor and the semiconductor substrate) because a metal deteriorating the junction leak is very difficult to be used. Furthermore, in a memory cell having the COB structure, a memory node contact part of poly-Si is formed after the formation of the BL since the capacitor is formed on the BL, and therefore the BL cannot be formed with a metal having a low melting point. As described in the foregoing, the compatibility between the formation process of the memory element and the formation process of the logic element is difficult to be realized because of the high barrier in the essential point.

SUMMARY OF THE INVENTION

The invention has been developed to solve the above problems.

The invention relates to, as a first aspect, a process for producing a semiconductor device comprising first to sixth steps. In the first step, a conductive pattern is formed on a first region and a second region of a semiconductor substrate, a first insulating film is formed along a shape of the conductive pattern on the semiconductor substrate, and a second insulating film comprising a material that ensures an etching selectivity with the first insulating film is formed on the first insulating film to make its surface flat. In the second step, a contact hole is formed at least in the first insulating film and the second insulating film in the first region, and a side wall comprising a material that ensures an etching selectivity with the second insulating film and prevents its own silicidation is formed on an inner wall of the contact hole. In the third step, a plug is formed by embedding a conductive material in the contact hole via the side wall. In the fourth step, the second insulating film is removed by etching, to expose the plug and the first insulating film, and the first insulating film only in the second region is subjected to etch back, to form a spacer side wall comprising the first insulating film on a side wall of the conductive pattern in the second region, and to expose a surface of the semiconductor substrate in the second region. In the fifth step, a silicide layer is formed on the exposed surface of the semiconductor substrate. In the sixth step, a third insulating film comprising a material that ensures an etching selectivity with the first insulating film is formed over the plug, the first insulating film and the conductive pattern, and a surface of the third insulating film is flattened to expose an upper surface of the plug.

In the first aspect of the invention, because the silicide layer is formed on the surface of the semiconductor substrate in the second region after the formation of the plug, the heat treatment to activate the impurities contained in poly-Si can be conducted before the formation of the silicide layer even if a conductive material composed of poly-Si is used to form the plug. Therefore, troubles of coagulation of the silicide layer on the heat treatment do not occur. Because of the same reason, the plug can be formed with poly-Si. Furthermore, because the side wall is formed with a material preventing silicidation of the side wall of the plug, in the subsequent formation of the silicide layer, the silicide layer is selectively formed on the exposed surface of the semiconductor substrate in the second region and the upper surface of the plug. The silicide layer on the upper surface of the plug can be removed in the subsequent flattening step of the third insulating film. Thus, the silicide layer can be formed only on the exposed surface of the semiconductor substrate in the second region with preventing proceeding of silicidation of the upper surface of the plug which becomes a factor of leakage. No step is formed between the first region and the second region because after the formation of the silicide layer, the third insulating film is formed on the semiconductor substrate and the surface of the third insulating film is then flattened. Accordingly, in the case where a contact part and an embedded circuit are formed in the third insulating film in both the first region and the second region, they have surfaces of the same level.

The invention relates to, as a second aspect, a process for producing a semiconductor device comprising first to sixth steps. In the first step, the same procedures in the first step of the first aspect are conducted. In the second step, a contact hole reaching the semiconductor substrate is formed at least in the insulating film and the second insulating film in the first region, and a plug is formed by embedding a conductive material in the contact hole. In the third step, the second insulating film is removed by etching, to expose the plug and the first insulating film, and a third insulating film is formed over the plug and the first insulating film. In the fourth step, the third insulating film and the first insulating film only in the second region is subjected to etch back, to form a spacer side wall comprising the third insulating film and the first insulating film on a side wall of the conductive pattern in the second region, and to expose a surface of the semiconductor substrate in the second region. In the fifth step, a silicide layer is formed on the exposed surface of the semiconductor substrate. In the sixth step, a fourth insulating film comprising a material that ensures an etching selectivity with the third insulating film is formed over the plug and the first insulating film, and a surface of the fourth insulating film is flattened to expose an upper surface of the plug.

In the second aspect of the invention, because the silicide layer is formed on the surface of the semiconductor substrate in the second region after the formation of the plug, the heat treatment to activate the impurities contained in poly-Si can be conducted before the formation of the silicide layer even if a conductive material composed of poly-Si is used to form the plug. Therefore, troubles of coagulation of the silicide layer on the heat treatment do not occur. Because of the same reason, the plug can be formed with poly-Si. Furthermore, because the silicide layer is formed after the plug is covered with the third insulating film, the silicide layer is selectively formed on the exposed surface of the semiconductor substrate in the second region. No step is formed between the first region and the second region because after the formation of the silicide layer, the fourth insulating film is formed on the semiconductor substrate to cover the plug and the first insulating film and the surface of the fourth insulating film is then flattened. Accordingly, in the case where a contact part and an embedded circuit are formed in the fourth insulating film in both the first region and the second. region, they have surfaces of the same level.

BRIEF DESCRIPTION OF THE DRAWINGS

FIG. 1 is a cross sectional view of the related parts showing an example of a conventional process for producing a semiconductor device, in which (I) is a cross sectional view of the cell region along the line perpendicular to the BL, (II) is a cross sectional view of the cell region along the line perpendicular to the WL, and (III) is a cross sectional view of the logic region.

FIGS. 2A to 6H are cross sectional views of the related parts showing the first embodiment of the process for producing a semiconductor device according to the invention. Symbols (I), (II) and (III) are the same as in FIG. 1.

FIGS. 7A to 10G are cross sectional views of the related parts showing the second embodiment of the process for producing a semiconductor device according to the invention. Symbols (I), (II) and (III) are the same as in FIG. 1.

DETAILED DESCRIPTION OF THE PREFERRED EMBODIMENTS

Figure 2A:
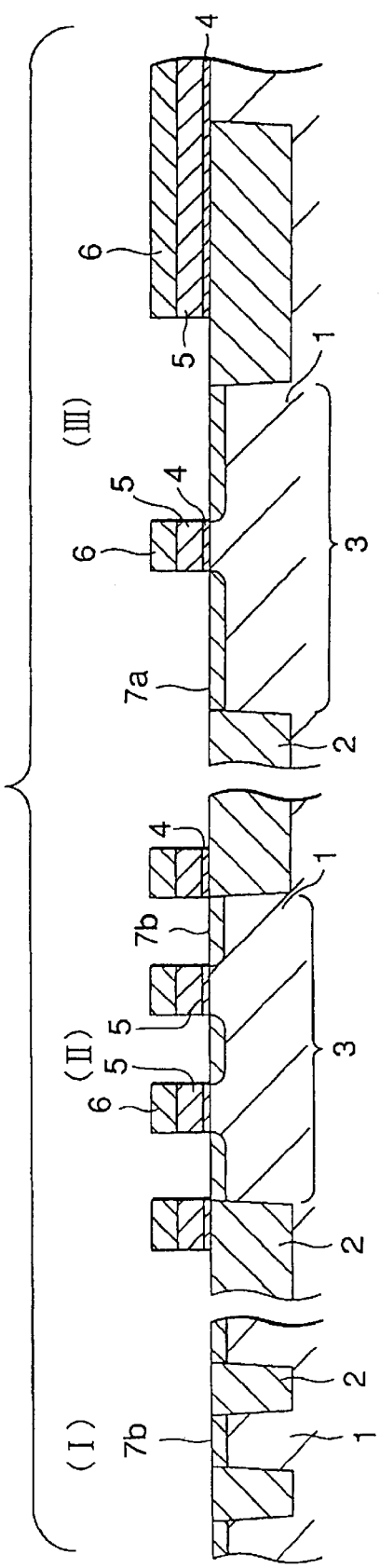

Embodiments of the process for producing a semiconductor device according to the invention are described referring to the drawings. In this embodiment, the invention is applied to the production of an LSI comprising a memory element and a logic element consolidated therein (hereinafter referred to "memory consolidated logic LSI"), in which the first region in the invention is designated for a region where a DRAM element is formed (hereinafter referred to "cell region"), and the second region is designated for a region where a logic element is formed (hereinafter referred to "logic region").

FIGS. 2A to 6H are cross sectional views showing the related parts of the first embodiment in the order of the steps, which is in accordance with the first aspect of the invention. In these Figures, (I) is a cross sectional view of the cell region along the line perpendicular to the BL, (II) is a cross sectional view of the cell region along the line perpendicular to the WL, and (III) is a cross sectional view of the logic region. In the process for producing a memory consolidated logic LSI according to the first embodiment, an element separating region 2, a gate insulating film 4, a gate electrode 5 becoming a conductive pattern of the invention, an insulating film pattern 6 and impurity-introduced layers 7a and 7b are formed on a semiconductor substrate 1 before conducting the first step, as shown in FIG. 2A.

Accordingly, the element separating region 2 for separating a region where an element is formed (hereinafter referred to "element forming region") is formed in the cell region and the logic region of the semiconductor substrate comprising Si by a known element separation technique. As the semiconductor substrate 1, those containing impurities in a concentration of $3\times10^{17}$ per cubic centimeter in the cell region and a concentration of $6\times10^{17}$ per cubic centimeter in the logic cell region are used, for example. As the element separating region 2, a trench element separating region comprising an $SiO_2$ film at a depth of about 300 nm, for example, is formed in the semiconductor substrate 1. The element separating region 2 may not be a stoichiometric SiO$_2$ film but may contain other elements. Furthermore, other techniques than the trench element separation technique, such as an LOCOS element separation technique, may be employed, and combinations thereof may also be employed.

A gate insulating film 4 is then formed in the element forming region 3 of the semiconductor substrate 1. The gate insulating film 4 is formed in such a manner that it has thickness different from each other in the cell region and the logic region, respectively. For example, the thickness is about 7 nm in the cell region and about 5 nm in the logic region, respectively. As the gate insulating film 4, an SiO$_2$ film or an oxide film of silicon nitride formed by a thermal oxidation process is employed, for example.

A gate electrode 5 is formed in the cell region and the logic region of the semiconductor substrate 1 through the gate insulating film 4. For example, a gate electrode 5 having a polycide structure comprising a poly-Si film formed on the gate insulating film 4 and a WSi$_2$ film formed on the upper layer thereof is formed in a thickness of from about 100 to 200 nm. This may be constituted by a polycide of poly-Si and other metallic silicide layer. As the gate electrode 5 in the logic region, a surface channel gate of a complementary metal oxide semiconductor field effect transistor (CMOSFET), which is called a dual gate structure, may be employed. The gate electrode 5 also serves as a WL.

An insulating film pattern 6 comprising, for example, SiO$_2$ and Si$_3$N$_4$ is formed on the respective gate electrodes 5 in a thickness of about from about 100 to 150 nm. The insulating film pattern is for preventing silicidation of the gate electrode 5 on a step of forming a silicide layer described later. This may be considered to be applied to a self-aligned contact formation process. The prescribed impurities are introduced to the both ends of the gate electrode 5 in the logic region and the cell region of the semiconductor substrate 1 to form impurity-introduced layers 7a and 7b. The impurity-introduce layer 7a in the logic region is, for example, for an LDD diffusion layer, into which an impurity is introduced to a concentration of from about $1 \times 10^{18}$ to $1 \times 10^{19}$ per cubic centimeter. An impurity is introduced into the impurity-introduced layer 7b in the cell region in a concentration of about $1 \times 10^{18}$ per cubic centimeter.

Figure 2B:
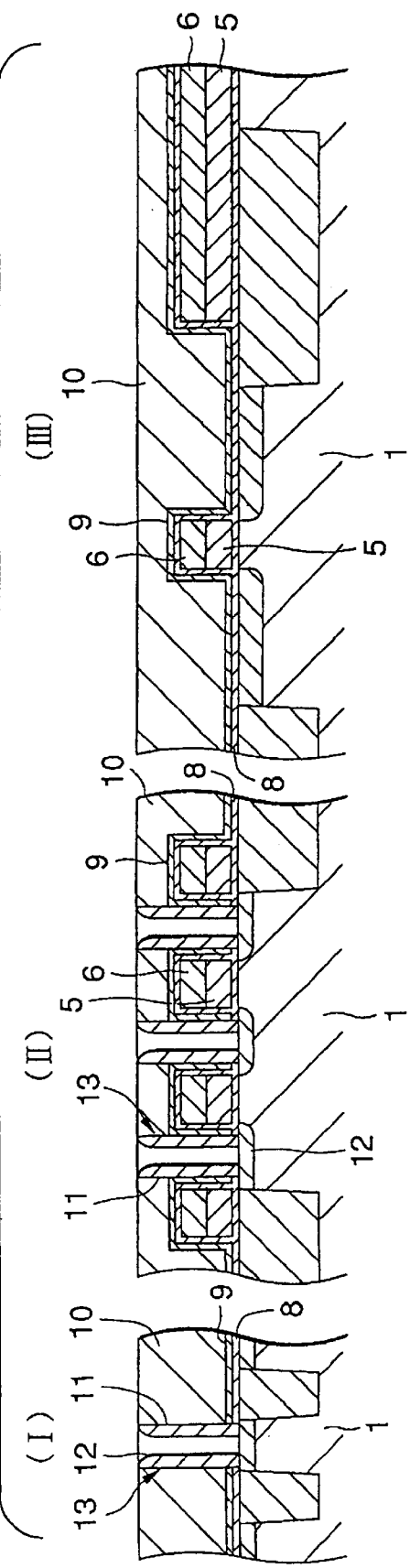

After forming the impurity-introduced layers 7a and 7b, the first step is conducted, in which a first insulating film 9 and a second insulating film 10 are formed on the semiconductor substrate 1 through an adhesion preventing layer 8, as shown in FIG. 2B. For example, the adhesion preventing layer 8 comprising an insulating film is formed to cover the gate electrode 5 and the insulating film pattern 6 by a chemical vapor deposition (CVD) process. The adhesion preventing layer 8 is provided to prevent adhesion between the semiconductor substrate 1 and the first insulating film 9, and also to improve the withstand voltage of insulation. It comprises, for example, an SiO$_2$ series film containing no impurity formed by a vacuum CVD process using TEOS (Si(OC$_2$H$_5$)$_4$) as an Si target (hereinafter referred to "LP-TEOS NSG film"). The adhesion preventing layer 8 is conformally formed along the gate electrode 5 and the insulating film pattern 6. In this embodiment, since the first insulating film is formed with an Si$_3$N$_4$ film described later, the adhesion preventing layer 8 is formed with an SiO$_2$ film in a thickness of about 20 nm.

The first insulating film 9 is conformally formed along the gate electrode 5 and the insulating film pattern 6 on the semiconductor substrate 1 through the adhesion preventing layer 8, for example, by a CVD process. Any insulating material may be used for forming the first insulating film 9 if the insulating material can ensure the etching selectivity with the second insulating film 10 formed thereon on the wet etching described later. In this embodiment, since the second insulating film 10 is formed with an SiO$_2$ series film, the first insulating film 9 is formed with an Si$_3$N$_4$ film in a thickness of about 50 nm, which can ensure the etching selectivity with the second insulating film 10.

The second insulating film 10 comprising, for example, an SiO$_2$ film on the first insulating film 9 in such a thickness that the surface thereof becomes flat by a CVD process, for example. In this embodiment, a single layer or a composite layer comprising plural layers of an SiO$_2$ series film, such as an LP-TEOS NSG film, a boron silicate glass (BSG) film and a boron phosphosilicate glass (BPSG) film. The surface of the second insulating film 10 is flattened by a method such as etch back or chemical mechanical polishing (CMP). The reason why the flattening is conducted is that when a step is present on the surface of the second insulating film 10, a trouble arises where the poly-Si remains without being removed in the subsequent step for forming a plug comprising poly-Si by etch back or CMP.

A contact hole 11 reaching the impurity-introduced layers 7a and 7b is formed in each of the cell region and the logic region of the adhesion preventing layer 8, the first insulating film 9 and the second insulating film 10. The contact hole 11 is formed in each of the related parts, such as the region where a bit contact part is formed, a region where a memory node contact part is formed, and a part of peripheral circuits. A side wall 12 is then formed on the inner wall of the contact hole 11 (second step). The side wall 12 may comprise various materials if the material can ensure etching selectivity with the second insulating film 10 in the subsequent wet etching step and also can prevent its own silicidation in the silicide step described later. In this embodiment, the side wall 12 is formed with an Si$_3$N$_4$ film, which is the same as the first insulating film 9.

A conductive material, such as poly-Si containing an impurity, is accumulated on the second insulating film 10 and also is filled in the contact hole 11 through the side wall 12, for example, by a CVD process. The poly-Si film is removed to the position, at which the upper surface of the second insulating film 10 is exposed, by etch back or CMP, to form a plug 13, in which poly-Si is embedded in the interior of the contact hole 11 through the side wall 12 (third step). It is possible that amorphous Si containing an impurity is embedded in the interior of the contact hole 11 instead of the poly-Si, and a heat treatment is conducted to crystallize the amorphous Si, to form a plug 13, in which poly-Si is embedded in the interior of the contact hole 11 through the side wall 12. The plug 13 becomes a bit contact part, a part of a memory node contact part and a contact part of peripheral circuits.

The second insulating film 10 is then removed, for example, by wet etching using hydrofluoric acid with using the first insulating film 9 and the side wall 12 as an etching stopper, so as to expose the plug 13 and the first insulating film 9, as shown in FIG. 3C. Because the first insulating film 9 is formed along the gate electrode 5 and the insulating film pattern 6 as described above, the step between the gate electrode 5 and the insulating film pattern 6, which has been once flattened, again appears by the removal of the second insulating film 10.

The first insulating film 9 is subjected to etch back while the desired part, such as the cell region, is masked with a resist, for example, so that a spacer side wall 14 comprising the first insulating film 9 is formed on the side wall of the gate electrode 5 and the insulating film pattern 6 in the logic region, and at the same time, the surface of the semiconductor substrate 1 is exposed (fourth step). Because the cell region is covered with the resist, the part other than the upper surface of the plug 13 is still covered with the first insulating film 9. The resist covering the cell region is then removed.

An impurity is introduced for forming the necessary diffusion layer in the semiconductor substrate 1 of the logic region, such as a source drain diffusion layer, by ion injection with using the gate electrode 5, the insulating film pattern 6 and the spacer side wall 14 as a mask. A heat treatment (at about 1,000° C. for example) is conducted to activate the impurities contained in the resulting impurity-introduced layer, the previously formed impurity-introduced layers 7a and 7b, and the poly-Si constituting the plug 13, so as to obtain a source drain diffusion layer 15 and a diffusion layer 7 such as LDD. In this embodiment, the source drain diffusion layer 15 having an impurity concentration of $1 \times 10^{20}$ per cubic centimeter or more is formed.

A silicide layer 16 is then formed by a conventional method (fifth step). For example, a titanium (Ti) film is formed on the whole surface of the semiconductor substrate 1, and then a heat treatment is conducted, to obtain a silicide layer 16 comprising a titanium silicide ($TiSi_2$) layer by a silicidation reaction between the Ti film and Si that is in direct contact with the Ti layer. Because the cell region other than the upper surface of the plug 13 is covered with the first insulating film 9 as described above, the silicide layer 16 is selectively formed only on the upper surface of the plug 13. In the logic region, the silicide layer 16 is selectively formed on the exposed surface of the semiconductor substrate 1, i.e., the surface of the source drain diffusion layer 15. The silicide layer 16 is not limited to the $TiSi_2$ layer and may be formed with a silicide of other metals such as cobalt (Co) and molybdenum (Mo).

All the heat treatment steps after this step are conducted within the range of heat resistant temperature of the silicide layer 16, i.e., at a temperature less than 800° C. Accordingly, as shown in FIG. 3D, a first interlayer insulating film 17 comprising a material that can ensure etching selectivity with the first insulating film 9 is formed on the semiconductor substrate 1 over the plug 13, the first insulating film 9, the gate electrode 5 and the insulating film pattern 6. The first interlayer insulating film 17 becomes the third insulating film of the first aspect of the invention and comprises an $SiO_2$ series film, such as an LP-TEOS NSG film, a PSG film and a BPSG film, which can ensure etching selectivity with the first insulating film 9 comprising an $Si_3N_4$ film.

The first interlayer insulating film 17 is then polished and removed to the position at which the upper surface of the plug 13 is exposed, for example, by CMP. Accordingly, the surface of the first interlayer insulating film 17 is flattened, and the silicide layer 16 formed on the upper surface of the plug 13 is removed (sixth step). By removing the silicide layer 16 formed on the upper surface of the plug 13, the progress of silicidation on the upper surface of the plug 13, which becomes a factor of leakage, is prevented in the subsequent steps.

A second interlayer insulating film 18 is formed on the first interlayer insulating film 17 as shown in FIG. 4E. The second interlayer insulating film 18 comprises, for example, the same $SiO_2$ series film as the first interlayer insulating film 17, and must be formed in a thickness larger than the thickness of a BL subsequently formed. A contact hole 19 reaching the semiconductor substrate 1, other contact hole 34 and a groove 20 for forming the BL are formed in the second interlayer insulating film 18 and the first interlayer insulating film 17 by lithography and etching. The etching is conducted under the condition where the etching selectivity is ensured between the first insulating film 9 and the side wall 12, i.e., the condition where the first insulating film 9 and the side wall 12 become an etching stopper.

After the inner walls of the contact holes 34 and 19 and the groove 20 are covered with a Ti film, the Ti film is further covered with a titanium nitride (TiN) film, and W is embedded in the interior of the contact hole 19 and the groove 20 through the Ti film and the TiN film. The Ti film is formed as an improving layer for improving the ohmic property with the under layer, and the TiN film is formed as a barrier layer or an adhesion layer. As a result, a BL 21 in ohmic contact with the plug and a contact part 22 are obtained in the cell region, and a contact part 23 in ohmic contact with the source drain diffusion layer 15, in which the first insulating film 9 is removed and the silicide layer 16 is formed on the surface, is obtained in the logic region.

An insulating film 24 is formed on the second interlayer insulating film 18 over the BL 21 and the contact parts 22 and 23 as shown in FIG. 5G. The insulating film 24 serves insulation between the BL 21 and a lower electrode of a capacitor subsequently formed thereon, and may comprise, for example, an LP-TEOS NSG film, a BSG film or a BPSG film. A contact hole 25 reaching the plug 13, which is formed at the position at which the memory node contact part is formed, is formed in the second interlayer insulating film 18 and the insulating film 24 directly above the plug 13 in the cell region.

A film comprising a material containing a metal (hereinafter referred to "metallic material film") is formed on the insulating film 24, and the metallic material is embedded in the contact hole 25 to form a contact part 26 connecting to the plug 13. A memory node contact part 27 is formed by the contact part 26 and the plug 13 connected thereto. As the metallic material film, a single layer or a laminated layer of a TiN film, a rubidium (Rb) film and an oxide film of Rb.

A lower electrode 28 of a capacitor is then obtained by patterning the metallic material layer on the insulating film 24. While in FIGS. 5G and 6H, an example where the lower electrode 28 is formed in a columnar shape is shown, it can be formed in other shapes. A capacitor insulating film 29 is then formed to cover the surface of the lower electrode 28. The capacitor insulating film 29 is formed with a material that can be formed within the range of the heat resistant temperature of the silicide layer 16 and has a high dielectric constant. Examples of such a material include tantalum oxide ($Ta_2O_5$) and BST composed of bismuth, strontium, titanium and titanium oxide. A capacitor 31 having an MIM structure is obtained by forming an upper electrode 30 comprising a metallic material film on the surface of the capacitor insulating film 29. As the metallic material film constituting the upper electrode 30, a TiN film and a laminated film of a TiN film and a film of a metal having a low resistance are exemplified.

A third interlayer insulating film 32 comprising an $SiO_2$ film as a main component, for example, is formed on the semiconductor substrate 1 over the capacitor 31, and a contact part 34 connecting an embedded wiring 33 to the source drain diffusion layer 15 via the contact part 23 is formed in the third interlayer insulating film 32 of both of the cell region and the logic region. The embedded wiring 33 and the contact part 34 are composed, for example, of a conductive material comprising a TiN film and a W film formed on the surface thereof. The embedded wiring 33 in the cell region becomes a backing wiring of the WL, and the embedded wiring in the logic region becomes a first metallic wiring. The first metallic wiring and the source drain diffusion layer 15 are connected to each other by the contact part 23 and the contact part 34. A memory consolidated logic LSI is thus produced by the foregoing steps.

In the process according to the first embodiment, the plug 13 is formed with poly-Si, and after conducting a heat treatment for activating the impurities contained in the poly-Si, the silicide layer 16 is formed on the semiconductor substrate 1 in the logic region. Accordingly, a trouble of coagulation of the silicide layer due to the heat treatment does not occur. After the formation of the silicide layer 16, since the formation of the BL 21 and the formation of the capacitor 31 are conducted by a low temperature process in the range of the heat resistant temperature of the silicide layer, the coagulation of the silicide layer 16 is prevented in these formation steps. Therefore, the resistance of the source drain diffusion layer 15 in the logic region can be reduced by the silicide layer 16 without deterioration of the characteristics, and a logic element of high performance and high speed can be produced.

In the contact part of the cell region, since the plug 13 using poly-Si can be applied as similar to the conventional art, a DRAM with small junction leakage and high data maintenance performance can be produced. By forming the BL 21 with a metallic material, the resistance of the BL 21 can be reduced, and thus the operation speed of the DRAM can be increased. Therefore, according to the first embodiment, an LSI comprising a DRAM of a large capacity and a high operation speed and a logic element of high speed and high performance consolidated therein can be produced.

After the formation of the silicide layer 16, the first interlayer insulating film 17 is formed on the semiconductor substrate 1, and the surface of the first interlayer insulating film 17 is flattened. Thus, no step is formed between the cell region and the logic region in this step. As a result, because the second interlayer insulating film 18 having a flat surface can be formed on the first interlayer insulating film 17, the contact part 23 can be formed in the first interlayer insulating film 17 and the second interlayer insulating film 18 of the logic region in such a manner that the upper surface of the contact part 23 is heightened to the same position as the upper surface of the BL 21, and thus the step between the cell region and the logic region can be relieved. Therefore, when the surface of the capacitor 31 formed on the cell region is completely flattened, fine working of a contact part and a wiring formed thereon can be easily conducted. As a result, further higher integration of an LSI can be realized.

In the first embodiment, because the upper surface of the contact part 23 in the logic region, the upper surface of the BL 21 of the cell region and the upper surface of the periphery of the cell region (the height of the cell plate) can be made in the similar height, the formation of a contact hole or a groove reaching them can be made at once, which has been conventionally conducted separately from each other. As a result, the number of steps in the production process can be reduced.

In the case where a dual gate is employed as the gate electrode in the logic region, after the formation of the silicide layer 16, the formation of the BL 21 and the formation of the capacitor 31 are conducted by a low temperature process. Therefore, effects are obtained, in which the penetration of an impurity introduced in the gate electrode on the formation of the BL 21 and the capacitor 31 into the semiconductor substrate 1 is prevented, and the mutual diffusion of the impurities between an N-type gate electrode and a P-type gate electrode is prevented.

Furthermore, after covering the gate electrode 5, which also serves as the WL, with the first insulating film 9, the first interlayer insulating film 17 comprising a material ensuring the etching selectivity with the first insulating film 9 is formed, and then the second interlayer insulating film 18 is formed thereon, followed by providing the BL 21 and the contact parts 22 and 23 therein. As a result, a short circuit between the WL and the BL 21 on their formation can be prevented.

The second embodiment of the invention is described below. FIGS. 7A to 10G are cross sectional views showing the related parts of the second embodiment in the order of the steps, which is in accordance with the second aspect of the invention. In these Figures, (I) is a cross sectional view of the cell region along the line perpendicular to the BL, (II) is a cross sectional view of the cell region along the line perpendicular to the WL, and (III) is a cross sectional view of the logic region. In FIGS. 7A to 10G, the same symbols are assigned to the same constitutional elements as in the first embodiment, and therefore their explanations are omitted herein.

Figure 7A:
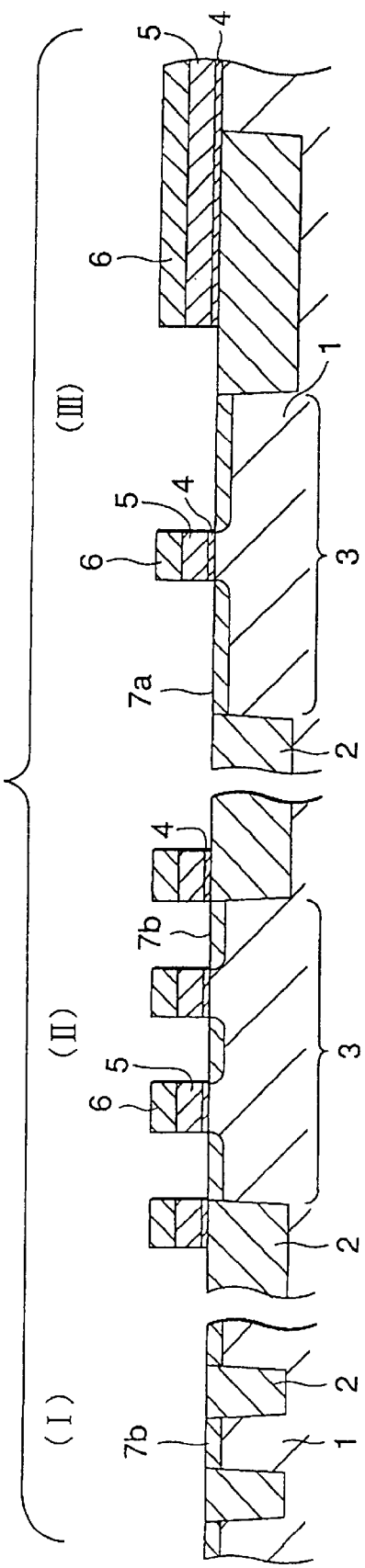
Figure 7B:
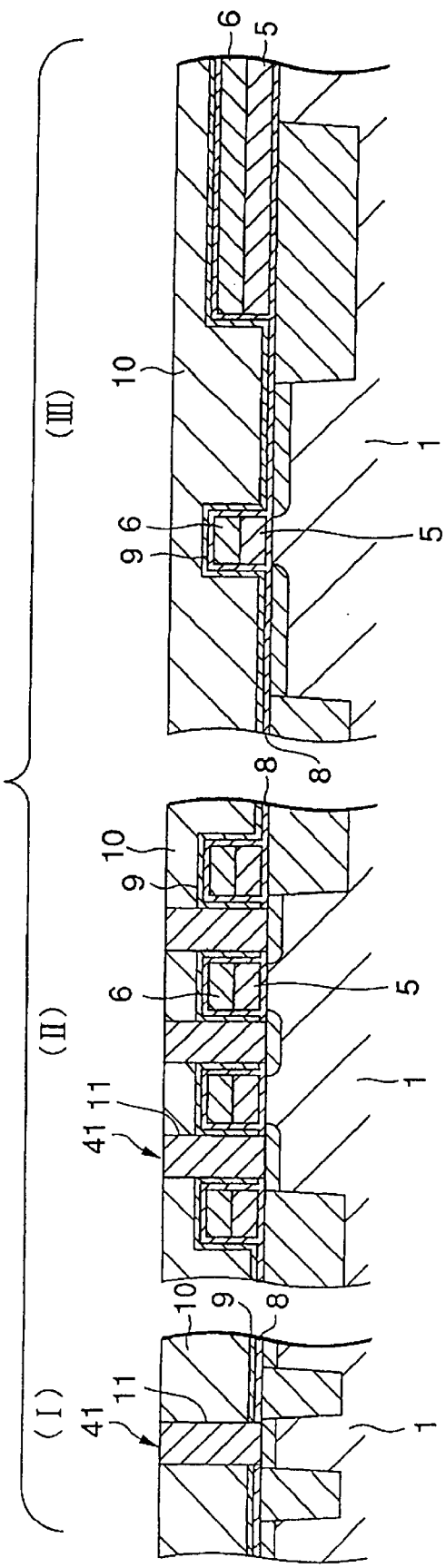

In the process for producing a memory consolidated logic LSI according to the second embodiment, an element separating region 2, a gate insulating film 4, a gate electrode 5 becoming a conductive pattern of the invention, an insulating film pattern 6 and impurity-introduced layers 7a and 7b are formed on a semiconductor substrate 1 before conducting the first step, as shown in FIG. 7A. A first insulating film 9 and the second insulating film 10 are formed on the whole surface of the semiconductor substrate 1 through an adhesion preventing layer 8 in the same manner as in the first embodiment (first step). In this case, the first insulating film 9 is conformally formed along the gate electrode 5 and the insulating film pattern 6, and the second insulating film 10 is formed on the first insulating film 9, followed by flattening the surface of the second insulating film.

A contact hole 11 reaching the impurity-introduced layers 7a and 7b is formed in each of the cell region and the logic region of the adhesion preventing layer 8, the first insulating film 9 and the second insulating film 10. The contact hole 11 is formed in each of the related parts, such as the region where a bit contact part is formed, a region where a memory node contact part is formed, and a part of peripheral circuits. A conductive material such as poly-Si containing an impurity is accumulated on the second insulating film 10 by a CVD process, for example, and at the same time, the poly-Si is embedded in the interior of the contact hole 11. The poly-Si film is removed to the position, at which the upper surface of the second insulating film 10 is exposed, by etch back or CMP, to form a plug 41, in which poly-Si is embedded in the interior of the contact hole 11 (second step).

It is possible that amorphous Si containing an impurity is embedded in the interior of the contact hole 11 instead of the poly-Si, and a heat treatment is conducted to crystallize the amorphous Si, to form a plug 41, in which poly-Si is embedded in the interior of the contact hole 11 through the side wall 12. The plug 41 becomes a bit contact part, a part of a memory node contact part and a contact part of peripheral circuits.

Figure 8C:
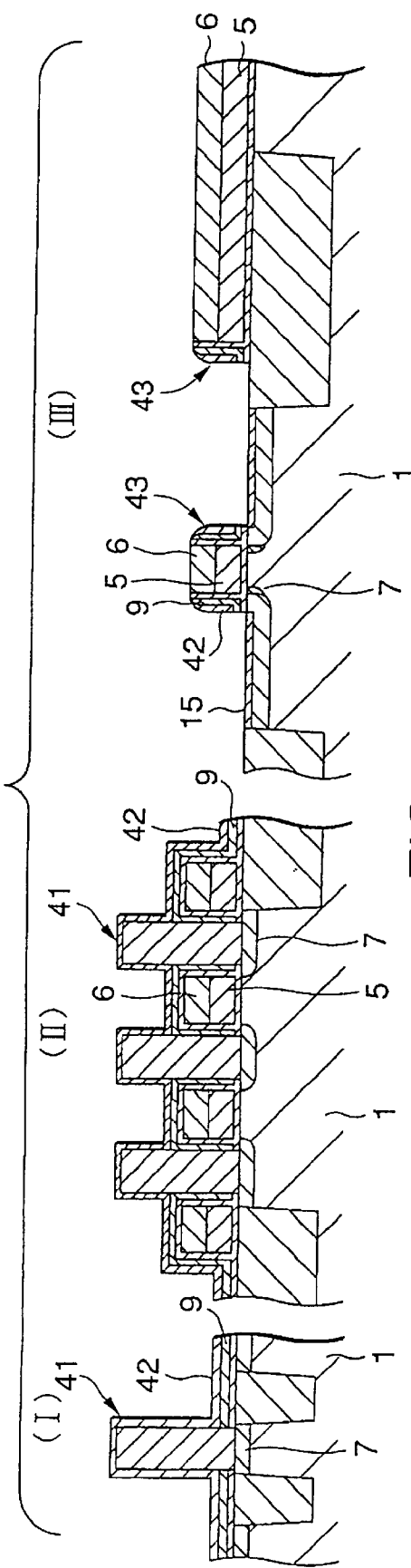

The second insulating film 10 is then removed, for example, by wet etching using hydrofluoric acid with using the first insulating film 9 and the plug 41 as an etching stopper, so as to expose the plug 41 and the first insulating film 9, as shown in FIG. 8C. Because the first insulating film 9 is formed along the gate electrode 5 and the insulating film pattern 6 as described above, the step between the gate electrode 5 and the insulating film pattern 6, which has been once flattened, again appears by the removal of the second insulating film 10. A third insulating film 42 is formed on the semiconductor substrate 1 over the plug 41 and the first insulating film 9 (third step). In this embodiment, the third insulating film 42 is formed with an $Si_3N_4$ film.

The third insulating film 41 and the first insulating film 9 are subjected to etch back while the desired part, such as the cell region, is masked with a resist, for example, so that a spacer side wall 43 comprising the third insulating film 42 and the first insulating film 9 is formed on the side wall of the gate electrode 5 and the insulating film pattern 6 in the logic region, and at the same time, the surface of the semiconductor substrate 1 in the logic region is exposed (fourth step). Because the cell region is covered with the resist, it is in a state that the first insulating film 9 still remains. The resist covering the cell region is then removed.

An impurity is introduced for forming the necessary diffusion layer in the semiconductor substrate 1 of the logic region, such as a source drain diffusion layer, by ion injection with using the gate electrode 5, the insulating film pattern 6 and the spacer side wall 43 as a mask. A heat treatment (at about 1,000° C. for example) is conducted to activate the impurities contained in the resulting impurity-introduced layer, the previously formed impurity-introduced layers 7a and 7b, and the poly-Si constituting the plug 41, so as to obtain a source drain diffusion layer 15 and a diffusion layer 7 such as LDD.

A silicide layer 16 is then formed by a conventional method (fifth step). The cell region is covered with the first insulating film 9, and therefore the silicide layer 16 is not formed. In the logic region, the silicide layer 16 is selectively formed on the exposed surface of the semiconductor electrode 1, i.e., the surface of the source drain diffusion layer 15. All the heat treatment steps after this step are conducted within the range of heat resistant temperature of the silicide layer 16, i.e., at a temperature less than 800° C.

Figure 8D:
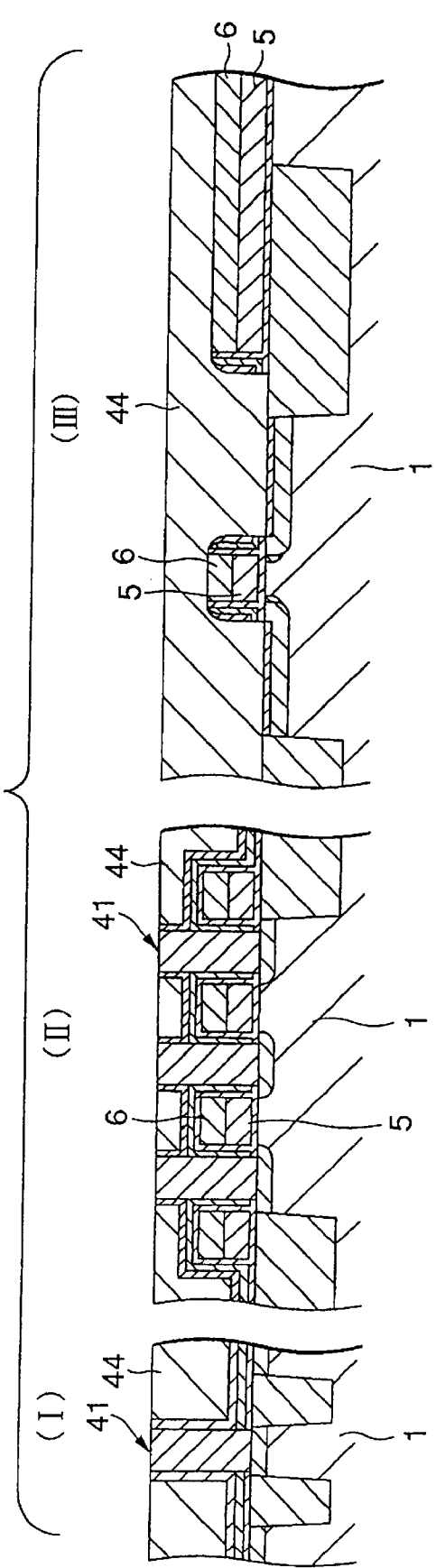

Accordingly, as shown in FIG. 8D, a first interlayer insulating film 44 comprising a material that can ensure etching selectivity with the first insulating film 9 is formed on the whole surface of the semiconductor substrate 1 over the plug 41, the gate electrode 5 and the insulating film pattern 6. The first interlayer insulating film 44 becomes the fourth insulating film of the second aspect of the invention and comprises an $SiO_2$ series film, such as an LP-TEOS NSG film, a BSG film and a BPSG film, which can ensure etching selectivity with the third insulating film 42 comprising an $Si_3N_4$ film. The first interlayer insulating film 44 is then polished and removed, for example, by CMP. At this time, the first interlayer insulating film 44 is polished along with the plug 41 to the level at which the upper surface of the plug 41 is exposed and the surface of the first interlayer insulating film 44 is flattened (sixth step).

Figure 9E:
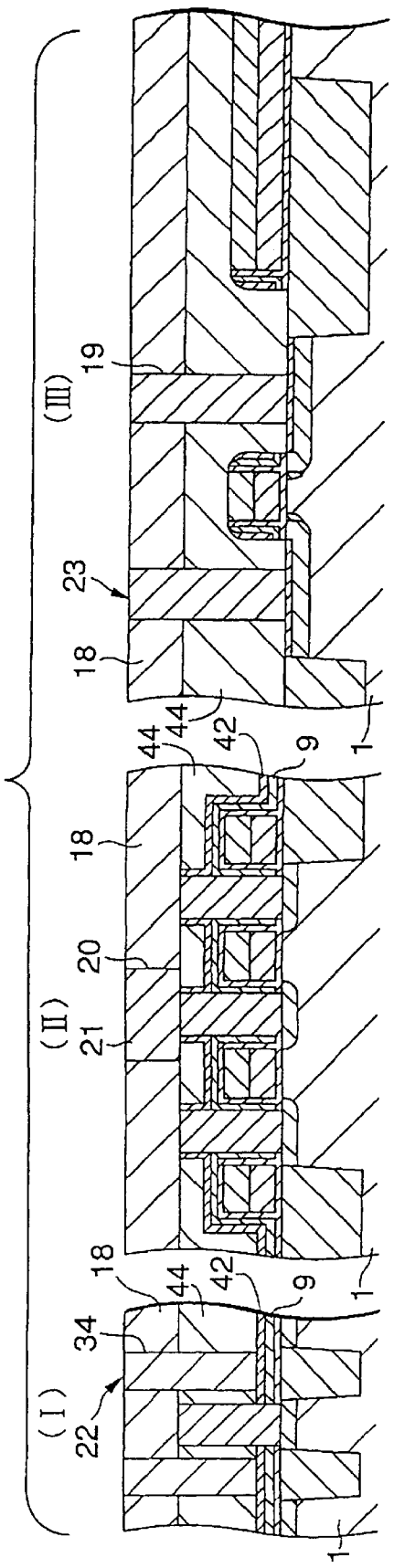

A second interlayer insulating film 18 is formed on the first interlayer insulating film 44 as shown in FIG. 9E. The second interlayer insulating film 18 comprises, for example, the same $SiO_2$ series film as the first interlayer insulating film 44, and must be formed in a thickness larger than the thickness of a BL subsequently formed. A contact hole 19 reaching the semiconductor substrate 1, other contact hole 34 and a groove 20 for forming the BL are formed in the second interlayer insulating film 18 and the first interlayer insulating film 44 by lithography and etching. The etching is conducted under the condition where the etching selectivity with the third insulating film 42 is ensured, i.e., the condition where the third insulating film 42 becomes an etching stopper.

Figure 9F:
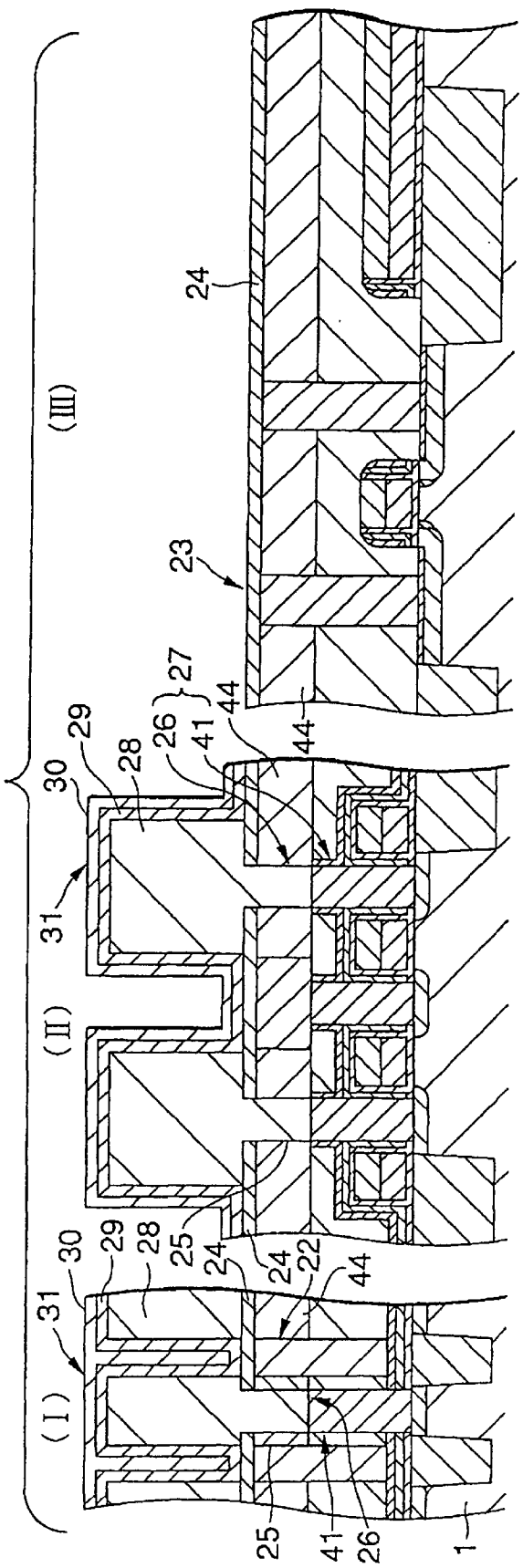

Subsequently, the similar steps as in the first embodiment are conducted. By filling the contact holes 19 and 34 and the groove 20 with a Ti film, a TiN film and W, a BL 21 in ohmic contact with the plug 41 and a contact part 22 are obtained in the cell region, and a contact part 23 in ohmic contact with the source drain diffusion layer 15, in which the silicide layer 16 is formed on the surface, is obtained in ;he logic region. An insulating film 24 is formed on the second interlayer insulating film 18 over the BL 21 and the contact parts 22 and 23 as shown in FIG. 9F. A contact hole 25 reaching the plug 41, which is formed at the position at which the memory node contact part is formed, is formed in the second interlayer insulating film 18 and the insulating film 24.

A contact part 26 connecting to the plug 41 is formed by filling the contact hole 25 with the metallic material, and a lower electrode 28 of a capacitor is formed with the metallic material on the insulating film 24. A memory node contact part 27 is formed with the contact part 26 and the plug 41 connected thereto. A capacitor insulating film 29 is then formed to cover the surface of the lower electrode 28, and an upper electrode 30 comprising the metallic material is formed on the surface of the capacitor insulating film 29, to obtain a capacitor 31 having an MIM structure.

Figure 10G:
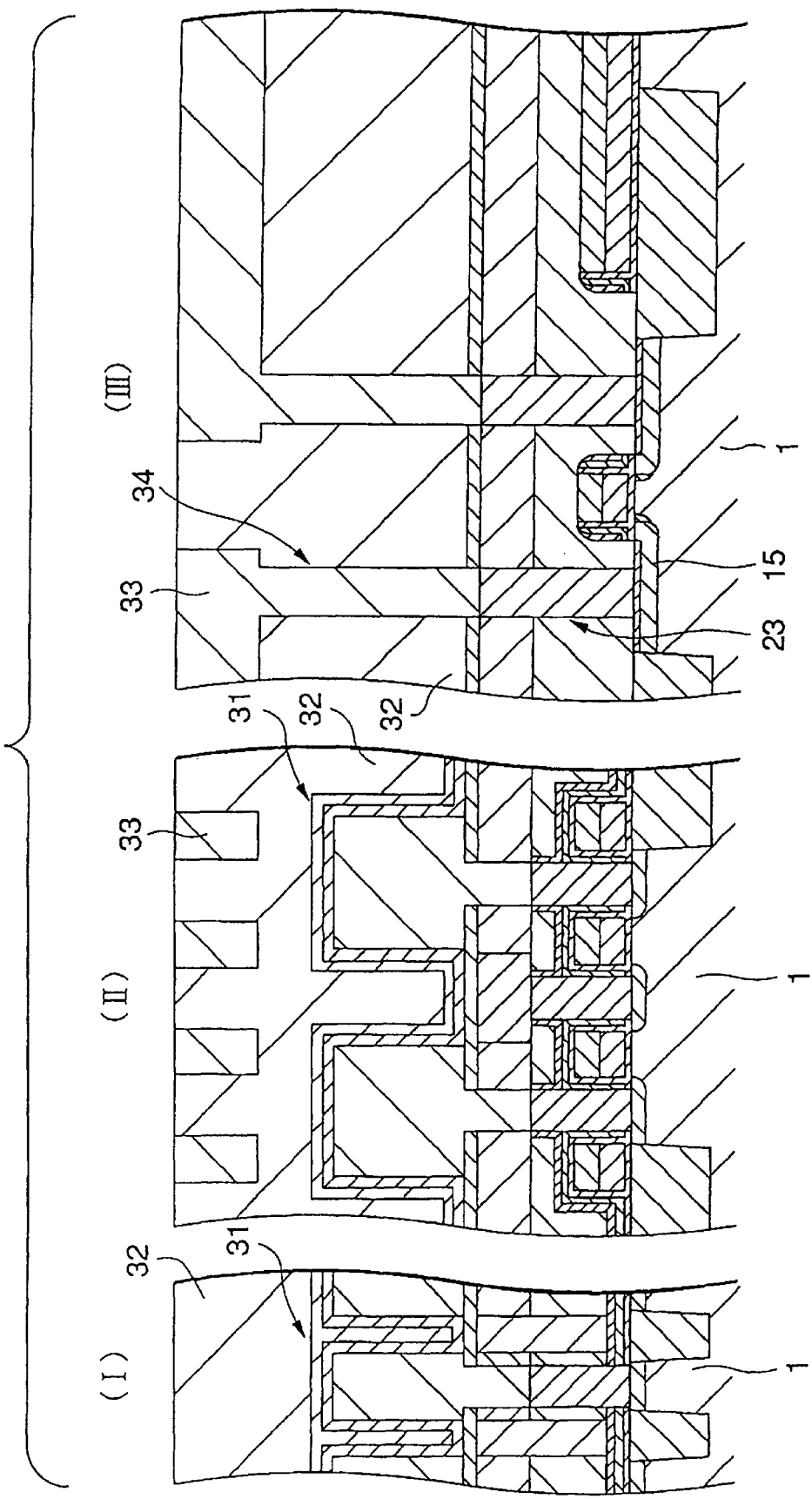

Furthermore, as shown in FIG. 10G, a third interlayer insulating film 32 is formed on the semiconductor substrate 1 over the capacitor 31, and a contact part 34 connecting an embedded wiring 33 to the source drain diffusion layer 15 via the contact part 23 is formed in the third interlayer insulating film 32 of both of the cell region and the logic region. A memory consolidated logic LSI is thus produced by the foregoing steps.

In the process according to the second embodiment, after conducting a heat treatment for activating the impurities contained in the poly-Si of the plug 41, the silicide layer 16 is formed on the semiconductor substrate 1 in the logic region. Accordingly, a trouble of coagulation of the silicide layer 16 due to the heat treatment does not occur. As similar to the first embodiment, after the formation of the silicide layer 16, since the formation of the BL 21 and the formation of the capacitor 31 are conducted by a low temperature process in the range of the heat resistant temperature of the silicide layer 16, the coagulation of the silicide layer 16 is prevented in these formation steps. Therefore, the resistance of the source drain diffusion layer 15 in the logic region can be reduced by the silicide layer 16 without deterioration of the characteristics, and a logic element of high performance and high speed can be produced.

As similar to the first embodiment, in the case where a dual gate is employed as the gate electrode in the logic region for forming the BL 21 and the capacitor 31 by a low temperature process, the penetration of an impurity introduced in the gate electrode into the semiconductor substrate 1 is prevented, and the mutual diffusion of the impurities between an N-type gate electrode and a P-type gate electrode is prevented.

In the contact part of the cell region, since the plug 41 using poly-Si can be applied as similar to the conventional art, a DRAM with small junction leakage and high data maintenance performance can be produced. By forming the BL 21 with a metallic material, the resistance of the BL 21 can be reduced, and thus a DRAM having a high operation speed can be produced. Therefore, according to the second embodiment, an LSI comprising a DRAM of a large capacity and a high operation speed and a logic element of high speed and high performance consolidated therein can be produced.

As similar to the first embodiment, after the formation of the silicide layer 16, the first interlayer insulating film 44 is formed on the semiconductor substrate 1, and the surface of the first interlayer insulating film 44 is flattened. Thus, no step is formed between the cell region and the logic region in this step. As a result, the upper surface of the contact part 23 formed in the first interlayer insulating film 44 and the second interlayer insulating film 18 formed thereon of the logic region is heightened to the same position as the upper surface of the BL 21, and thus the step between the cell region and the logic region can be relieved. Therefore, in the second embodiment, when the surface of the capacitor 31 formed on the cell region is completely flattened, fine working of a contact part and a wiring formed thereon can be easily conducted. As a result, further higher integration of an LSI can be realized.

In the second embodiment, as similar to the first embodiment, because the upper surface of the contact part 23 in the logic region, the upper surface of the BL 21 in the cell region and the upper surface of the periphery in the cell region (the height of the cell plate) can be made in the similar height, the formation of a contact hole or a groove reaching them :an be made at once. As a result, the number of steps in the production process can be reduced. Furthermore, after covering the gate electrode 5, which also serves as the WL, with the first insulating film 9 and the third insulating film 42, the first interlayer insulating film 44 comprising a material ensuring the etching selectivity with the third insulating film 42 is formed, and then the second interlayer insulating film 18 is formed thereon, followed by providing the BL 21 and the contact parts 22 and 23 therein. As a result, a short circuit between the WL and the BL 21 on their formation can be prevented.

In the third step of the second embodiment, while the third insulating film 42 is formed, for example, by a CVD process, the formation of the third insulating film 42 may be conducted by a rapid thermal nitrization (RTN) process. For example, an RTN process in an ammonia ($NH_3$) atmosphere at about 900° C. can be employed. In this case, since an $Si_3N_4$ film selectively grows on the exposed part of the plug 41 comprising poly-Si rather than the first insulating film 9, an advantage can be obtained where the width of the spacer side wall 43 is easy to be controlled.

The process for producing a semiconductor device according to the invention is not construed as being limited to the first and second embodiments described above, and the formation conditions and the materials can properly changed unless the change violates the gist of the invention.

As described in the foregoing, in the first aspect of the process for producing a semiconductor device of the invention, because the silicide layer is formed after the formation of the plug, the plug can be produced with poly-Si, and the coagulation of the silicide layer due to the heat treatment of the poly-Si can be prevented. Therefore, when a diffusion layer is formed on the surface of the semiconductor substrate in the second region where the silicide layer is formed, the resistance of the diffusion layer can be reduced without deterioration of characteristics, and the junction leakage can be suppressed. Accordingly, in the case where the invention is applied to the production of a DRAM consolidated logic LSI where the first region is the cell region and the second region is the logic region, a plug comprising poly-Si can be applied to the contact part of the cell region, and a diffusion layer having a low resistance can be formed in the logic region. As a result, a DRAM of a large capacity and high data maintenance performance and a logic element of high speed and high performance can be produced. Furthermore, after the formation of the silicide layer, because the flattened third insulating film is formed on the whole surface of the semiconductor substrate, the formation of a step between the first region and the second region can be prevented. Accordingly, fine working of the contact part and the wiring formed on the third insulating film can be easily conducted, and thus further higher integration of a semiconductor device can be realized.

In the second aspect of the process for producing a semiconductor device of the invention, as similar to the first aspect of the invention, because the silicide layer is formed after the formation of the plug, when a diffusion layer is formed on the surface of the semiconductor substrate in the second region where the silicide layer is formed, the resistance of the diffusion layer can be reduced without deterioration of characteristics, and the junction leakage can be suppressed. Accordingly, in the case where the invention is applied to the production of a DRAM consolidated logic LSI where the first region is the cell region and the second region is the logic region, the same effect as in the first aspect of the invention can be obtained, where a DRAM of a large capacity and high data maintenance performance and a logic element of high speed and high performance can be produced. Furthermore, after the formation of the silicide layer, because the flattened fourth insulating film is formed on the whole surface of the semiconductor substrate, the formation of a step between the first region and the second region can be prevented. Accordingly, as similar to the first aspect of the invention, fine working of the contact part and the wiring formed on the third insulating film can be easily conducted, and thus further higher integration of a semiconductor device can be realized.

What is claimed is:

1. A process for producing a semiconductor device comprising:

a first step, in which a conductive pattern is formed on a first region and a second region of a semiconductor substrate, a first insulating film is formed along a shape of said conductive pattern on said semiconductor substrate, and a second insulating film comprising a material that ensures an etching selectivity with said first insulating film is formed on said first insulating film to make its surface flat;

a second step, in which a contact hole is formed at least in said first insulating film and said second insulating film in said first region, and a side wall comprising a material that ensures an etching selectivity with said second insulating film and prevents its own silicidation is formed on an inner wall of said contact hole;

a third step, in which a plug is formed by embedding a conductive material in said contact hole via said side wall;

a fourth step, in which said second insulating film is removed by etching, to expose said plug and said first insulating film, and said first insulating film only in said second region is subjected to etch back, to form a spacer side wall comprising said first insulating film on a side wall of said conductive pattern in said second region, and to expose a surface of said semiconductor substrate in said second region;

a fifth step, in which a silicide layer is formed on said exposed surface of said semiconductor substrate; and a sixth step, in which a third insulating film comprising a material that ensures an etching selectivity with said first insulating film is formed over said plug, said first insulating film and said conductive pattern, and a surface of said third insulating film is flattened to expose an upper surface of said plug.

2. A process for producing a semiconductor device as claimed in claim 1, wherein said semiconductor device comprises a memory element and a logic element consolidated therein;

said semiconductor substrate comprises a region for forming said memory element as said first region, and a region for forming said logic element as said second region; and said process further comprises, after said sixth step, a step of forming a capacitor in said region for forming said memory element.

3. A process for producing a semiconductor device as claimed in claim 2, wherein in said step of forming a capacitor, a lower electrode comprising a metallic material is formed above said third insulating film, a capacitor insulating film is formed on a surface of said lower electrode, and an upper electrode comprising a metallic material is formed on a surface of said capacitor insulating film.

4. A process for producing a semiconductor device comprising:

a first step, in which a conductive pattern is formed on a first region and a second region of a semiconductor substrate, a first insulating film is formed along a shape of said conductive pattern on said semiconductor substrate, and a second insulating film comprising a material that ensures an etching selectivity with said first insulating film is formed on said first insulating film to make its surface flat;

a second step, in which a contact hole reaching said semiconductor substrate is formed at least in said insulating film and said second insulating film in said first region, and a plug is formed by embedding a conductive material in said contact hole;

a third step, in which said second insulating film is removed by etching, to expose said plug and said first insulating film, and a third insulating film is formed over said plug and said first insulating film;

a fourth step, in which said third insulating film and said first insulating film only in said second region is subjected to etch back, to form a spacer side wall comprising said third insulating film and said first insulating film on a side wall of said conductive pattern in said second region, and to expose a surface of said semiconductor substrate in said second region;

a fifth step, in which a silicide layer is formed on said exposed surface of said semiconductor substrate; and a sixth step, in which a fourth insulating film comprising a material that ensures an etching selectivity with said third insulating film is formed over said plug and said first insulating film, and a surface of said fourth insulating film is flattened to expose an upper surface of said plug.

5. A process for producing a semiconductor device as claimed in claim 4, wherein said semiconductor device comprises a memory element and a logic element consolidated therein;

said semiconductor substrate comprises a region for forming said memory element as said first region, and a region for forming said logic element as said second region; and said process further comprises, after said sixth step, a step of forming a capacitor in said region for forming said memory element.

6. A process for producing a semiconductor device as claimed in claim 5, wherein in said step of forming a capacitor, a lower electrode comprising a metallic material is formed above said fourth insulating film, a capacitor insulating film is formed on a surface of said lower electrode, and an upper electrode comprising a metallic material is formed on a surface of said capacitor insulating film.

* * * * *